United States Patent
Lin et al.

(10) Patent No.: US 10,598,997 B2
(45) Date of Patent: Mar. 24, 2020

(54) PIXEL ARRAY, DISPLAY PANEL AND CURVED DISPLAY PANEL

(71) Applicant: Au Optronics Corporation, Hsinchu (TW)

(72) Inventors: Chun-Feng Lin, Taichung (TW);
Yao-An Hsieh, New Taipei (TW);
Yu-Ping Kuo, New Taipei (TW);
Ching-Sheng Cheng, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/055,159

(22) Filed: Aug. 6, 2018

(65) Prior Publication Data
US 2018/0341161 A1    Nov. 29, 2018

Related U.S. Application Data

(62) Division of application No. 15/232,793, filed on Aug. 9, 2016, now Pat. No. 10,067,395.

(30) Foreign Application Priority Data

Aug. 10, 2015   (TW) .............................. 104125895 A

(51) Int. Cl.
*H01L 27/12*    (2006.01)
*G02F 1/1362*   (2006.01)
(Continued)

(52) U.S. Cl.
CPC .. *G02F 1/136286* (2013.01); *G02F 1/134336* (2013.01); *H01L 27/124* (2013.01);
(Continued)

(58) Field of Classification Search
CPC .............. H01L 27/1218; H01L 27/124; H01L 27/1262; G02F 1/134336; G02F 1/136286;
(Continued)

(56) References Cited

U.S. PATENT DOCUMENTS 7,834,962 B2 * 11/2010 Satake .............. G02F 1/133305
349/110
8,013,832 B2 *  9/2011 Chai ................... G09G 3/3648
345/103
(Continued)

FOREIGN PATENT DOCUMENTS

WO   WO 2014/153844   * 10/2014 ........... G02F 1/1343

*Primary Examiner* — Mary A Wilczewski
(74) *Attorney, Agent, or Firm* — JCIPRNET

(57) ABSTRACT

A pixel array includes pixel unit sets each including a substrate having first and second pixel regions, a scan line, first and second data lines extending along a second direction, first and second active devices respectively in the first and second pixel regions, and first and second pixel electrodes respectively located in the first and second pixel regions and electrically connected to the first and second active devices, respectively. The scan line includes a main scan line and first and second branch scan lines (connected to the main scan line) extending along a first direction. The first active device is electrically connected to the first branch scan line and the first data line. The second active device is electrically connected to the second branch scan line and the second data line. At least one of the first and second data lines is overlapped with the first and second pixel electrodes.

13 Claims, 9 Drawing Sheets

(51) Int. Cl.
*G02F 1/1343* (2006.01)
*G02F 1/1335* (2006.01)

(52) U.S. Cl.
CPC .... H01L 27/1218 (2013.01); *G02F 1/133512* (2013.01); *G02F 2001/134345* (2013.01); *G02F 2001/136295* (2013.01); *H01L 27/1262* (2013.01)

(58) Field of Classification Search
CPC ... G02F 1/133512; G02F 2001/134345; G02F 2001/136295; G02F 1/1343; G02F 1/134309; G02F 2201/122; G02F 2201/123
See application file for complete search history.

(56) References Cited

U.S. PATENT DOCUMENTS

| | | | | |
|---|---|---|---|---|
| 8,743,304 B2* | 6/2014 | Kim | G02F 1/136286 | 349/38 |
| 9,093,042 B2* | 7/2015 | Park | G09G 3/3648 | |
| 9,195,107 B2* | 11/2015 | Kim | G02F 1/134363 | |
| 9,472,140 B2* | 10/2016 | Kanda | G09G 3/3233 | |
| 9,575,376 B2* | 2/2017 | Liu | G02F 1/134363 | |
| 9,673,226 B2* | 6/2017 | Li | H01L 27/124 | |
| 9,715,151 B2* | 7/2017 | Jung | G02F 1/134363 | |
| 9,786,728 B2* | 10/2017 | Choi | H01L 51/5221 | |
| 10,067,395 B2* | 9/2018 | Lin | G02F 1/134336 | |
| 2003/0137614 A1* | 7/2003 | Nakayoshi | G02F 1/1343 | 349/43 |
| 2004/0032557 A1* | 2/2004 | Lee | G02F 1/134363 | 349/141 |
| 2007/0030233 A1* | 2/2007 | Chai | G09G 3/3648 | 345/98 |
| 2007/0085797 A1* | 4/2007 | Kim | G02F 1/136286 | 345/93 |
| 2007/0206011 A1* | 9/2007 | Han | G02F 1/134336 | 345/441 |
| 2008/0068527 A1* | 3/2008 | Um | G02F 1/13624 | 349/48 |
| 2008/0180400 A1* | 7/2008 | Kim | G06F 3/0412 | 345/173 |
| 2009/0109391 A1* | 4/2009 | Ito | G02F 1/134363 | 349/141 |
| 2009/0141010 A1* | 6/2009 | Liao | G02F 1/13624 | 345/205 |
| 2009/0161048 A1* | 6/2009 | Satake | G02F 1/133305 | 349/110 |
| 2010/0296040 A1* | 11/2010 | Han | G02F 1/134363 | 349/139 |
| 2011/0018910 A1* | 1/2011 | Chai | G09G 3/3648 | 345/690 |
| 2011/0032446 A1* | 2/2011 | Lee | G02F 1/13624 | 349/48 |
| 2011/0141424 A1* | 6/2011 | Lee | C09K 19/0275 | 349/141 |
| 2012/0013814 A1* | 1/2012 | Woo | G02F 1/134336 | 349/33 |
| 2012/0112213 A1* | 5/2012 | Lee | G02F 1/134363 | 257/88 |
| 2012/0162162 A1* | 6/2012 | Kong | H01L 27/1288 | 345/205 |
| 2012/0268813 A1* | 10/2012 | Kim | G02F 1/133512 | 359/450 |
| 2013/0027625 A1* | 1/2013 | Lee | G02F 1/134363 | 349/43 |
| 2013/0027646 A1* | 1/2013 | Cho | G02F 1/133512 | 349/106 |
| 2013/0033654 A1* | 2/2013 | Kim | G02F 1/133509 | 349/38 |
| 2013/0043477 A1* | 2/2013 | Jang | H01L 27/1259 | 257/59 |
| 2013/0120680 A1* | 5/2013 | Sun | G02F 1/1368 | 349/43 |
| 2013/0215089 A1* | 8/2013 | Wang | G09G 3/3677 | 345/204 |
| 2013/0335646 A1* | 12/2013 | Liao | G02F 1/1313 | 349/15 |
| 2014/0293181 A1* | 10/2014 | Lo | G02F 1/136286 | 349/43 |
| 2015/0062474 A1* | 3/2015 | Kim | H01L 27/1259 | 349/43 |
| 2015/0177579 A1* | 6/2015 | Lim | G02F 1/134336 | 345/90 |
| 2016/0202522 A1* | 7/2016 | Lee | G02F 1/133514 | 349/106 |
| 2016/0299391 A1* | 10/2016 | Liu | G02F 1/134336 | |
| 2016/0322016 A1* | 11/2016 | Kim | G09G 3/3648 | |
| 2016/0342058 A1* | 11/2016 | Park | G02F 1/136286 | |
| 2017/0045794 A1* | 2/2017 | Lin | G02F 1/134336 | |
| 2017/0160609 A1* | 6/2017 | Lee | G02F 1/136204 | |
| 2017/0162140 A1* | 6/2017 | Kim | G09G 3/3614 | |
| 2017/0192312 A1* | 7/2017 | Kim | G02F 1/133345 | |
| 2018/0341161 A1* | 11/2018 | Lin | G02F 1/134336 | |

* cited by examiner

PIXEL ARRAY, DISPLAY PANEL AND CURVED DISPLAY PANEL

CROSS-REFERENCE TO RELATED APPLICATION

This application is a divisional of and claims priority benefit of U.S. patent application Ser. No. 15/232,793, filed on Aug. 9, 2016, now allowed, which claims the priority benefit of Taiwan application serial no. 104125895, filed on Aug. 10, 2015. The entirety of each of the above-mentioned patent applications is hereby incorporated by reference herein and made a part of this specification.

FIELD OF DISCLOSURE

The disclosure relates to a pixel array, a display panel, and a curved display panel.

DESCRIPTION OF RELATED ART

With the advancement of science and technology, display technologies have also been continuously developing. Light, thin, compact, and slim flat panel displays (FPD) have gradually replaced the conventional cathode ray tube (CRT) displays. At present, the FPD characterized by compactness and slimness has been further employed on non-planar surfaces of various buildings or electronic equipment. In order to be adapted to the non-planar surfaces, the display panel is required to be cambered or curved to some extent, and thus a curved display panel has been proposed. During a process of manufacturing the curved display panel, two planar substrates are assembled and are then bent to form the curved surfaces. However, after the two substrates are bent, the components on the two substrates may be misaligned, such that the display quality of certain regions on the curved display panel may be deteriorated.

SUMMARY

The disclosure is directed to a pixel array, a display panel having the pixel array, and a curved display panel in order to resolve an issue of unfavorable display quality of certain regions on a curved display.

In an embodiment of the disclosure, a pixel array that includes a plurality of pixel unit sets is provided. Each of the pixel unit sets includes a substrate, a scan line, a first data line, a second data line, a third data, a first active device, a first pixel electrode, a second active device, a second pixel electrode, a third active device, and a third pixel electrode. The substrate has a first pixel region, a second pixel region, and a third pixel region. The scan line includes a main scan line as well as a first branch scan line, a second branch scan line, and a third branch scan line, wherein the first branch scan line, the second branch scan line, and the third branch scan line are connected to the main scan line and extend along a first direction. The first data line, the second data line, and the third data line extend along a second direction. The first active device is located in the first pixel region and is electrically connected to the first branch scan line and the first data line. The first pixel electrode is located in the first pixel region and electrically connected to the first active device. The second active device is located in the second pixel region and is electrically connected to the second branch scan line and the second data line. The second pixel electrode is located in the second pixel region and electrically connected to the second active device. The third active device is located in the third pixel region and is electrically connected to the third branch scan line and the third data line. The third pixel electrode is located in the third pixel region and is electrically connected to the third active device. Each of the first pixel electrode, the second pixel electrode, and the third pixel electrode has a bar-shaped electrode pattern, and the bar-shaped electrode pattern has at least one bent portion. At least one of the first data line and the second data line is overlapped with both of the first pixel electrode and the second pixel electrode.

In an embodiment of the disclosure, a display panel that has a central region, a first region, and a second region is provided. The first region and the second region are located at two sides of the central region, and the display panel includes a first substrate, a pixel array, a second substrate, and a color filter layer. The pixel array is located on the first substrate and includes a plurality of pixel unit sets, and each of the pixel unit sets is as set forth above. The second substrate is located opposite to the first substrate. The color filter layer is located on the first substrate or the second substrate, and the color filter layer is arranged corresponding to the pixel array. The light shielding pattern layer is located on the second substrate and is arranged corresponding to the color filter layer.

In an embodiment of the disclosure, a pixel array that includes a plurality of pixel unit sets is provided. Each of the pixel unit sets includes a substrate, a scan line, a first data line, a second data line, a third data, a first active device, a first pixel electrode, a second active device, a second pixel electrode, a third active device, and a third pixel electrode. The substrate has a first pixel region, a second pixel region, and a third pixel region. The scan line includes a main scan line as well as a first branch scan line, a second branch scan line, and a third branch scan line, wherein the first branch scan line, the second branch scan line, and the third branch scan line are connected to the main scan line and extend along a first direction. The first data line, the second data line, and the third data line extend along a second direction. The first active device is located in the first pixel region and is electrically connected to the first branch scan line and the first data line. The first pixel electrode is located in the first pixel region and electrically connected to the first active device. The second active device is located in the second pixel region and is electrically connected to the second branch scan line and the second data line. The second pixel electrode is located in the second pixel region and electrically connected to the second active device. The third active device is located in the third pixel region and is electrically connected to the third branch scan line and the third data line. The third pixel electrode is located in the third pixel region and is electrically connected to the third active device. One of the first data line, the second data line, and the third data line is overlapped with the first pixel electrode, the second pixel electrode, and the third pixel electrode. The third data line in each of the pixel unit sets and the first data line in a next pixel unit set along the first direction are located between the first pixel electrode, the second pixel electrode and the third pixel electrode in the each of the pixel unit sets and the first pixel electrode, the second pixel electrode and the third pixel electrode in the next pixel unit set along the first direction and are not overlapped with each other.

In view of the above, in each of the pixel unit sets of the pixel array provided herein, the scan line includes a main scan line, a first branch scan line, and a second branch scan line, and the first branch scan line and the second branch scan line are connected to the main scan line. At least one of the first data line and the second data line is overlapped with both of the first pixel electrode and the second pixel electrode. Said arrangement of the pixel array is conducive to the diverse selection of gate driving chips. In addition, in the curved display panel, the issue of unfavorable display quality resulting from the misalignment of the pixel unit sets on the pixel array and the devices on the other substrate can be resolved to a great extent.

Several exemplary embodiments accompanied with figures are described in detail below to further describe the disclosure in details.

DETAILED DESCRIPTION OF DISCLOSED EMBODIMENTS

Figure 1:
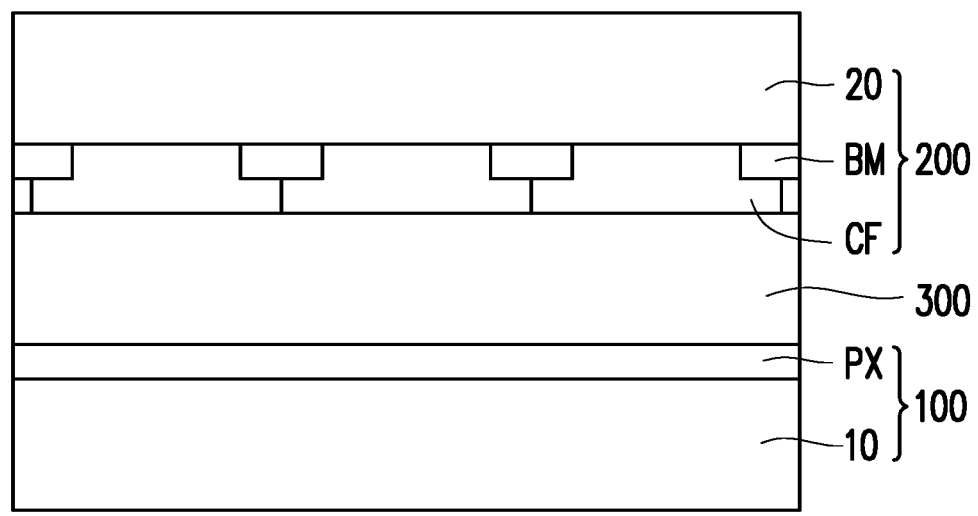
FIG. 1 is a schematic cross-sectional view illustrating a display panel according to an embodiment of the disclosure.

FIG. 1 is a schematic cross-sectional view illustrating a display panel according to an embodiment of the disclosure. In the present embodiment, the display panel includes a first substrate 10, a pixel array PX, a second substrate 20, and a color filter layer CF. With reference to the present embodiment, the display panel further includes a light shielding pattern layer BM and a display medium 300. Here, the first substrate 10 and the pixel array PX constitute the pixel array substrate 100, and the second substrate 20, the light shielding pattern layer BM, and the color filter layer CF constitute a color filter substrate 200. It should be mentioned that the color filter layer CF is not limited to be formed on the second substrate 20; in another embodiment of the disclosure, the color filter layer CF may be formed on the first substrate 10, so as to form a color-filter-on-array (COA) structure.

The first substrate 10 may be made of glass, quartz, or an organic polymer. The pixel array PX is located on the first substrate 10. The structure and the design of the pixel array PX will be elaborated hereinafter.

The second substrate 20 is located opposite to the first substrate 10. The second substrate 20 may be made of glass, quartz, or an organic polymer. The color filter layer CF is located on the second substrate 20 and arranged corresponding to the pixel array PX. The color filter layer CF is composed of, for instance, red, green, and blue filter patterns. The light shielding pattern layer BM is located on the second substrate 20 and arranged corresponding to the color filter layer CF. The light shielding pattern layer BM may also be referred to as a black matrix arranged among the color filter patterns of the color filter layer CF. An electrode layer (not shown) may be further arranged on the second substrate 20 and may serve as an opposite electrode of the pixel array PX.

The display medium 300 may include liquid crystal molecules, an electrophoretic display medium, or any other appropriate medium. According to the following embodiments, the display medium is the liquid crystal molecules, for instance, which should however not be construed as a limitation in the disclosure.

Figure 2:
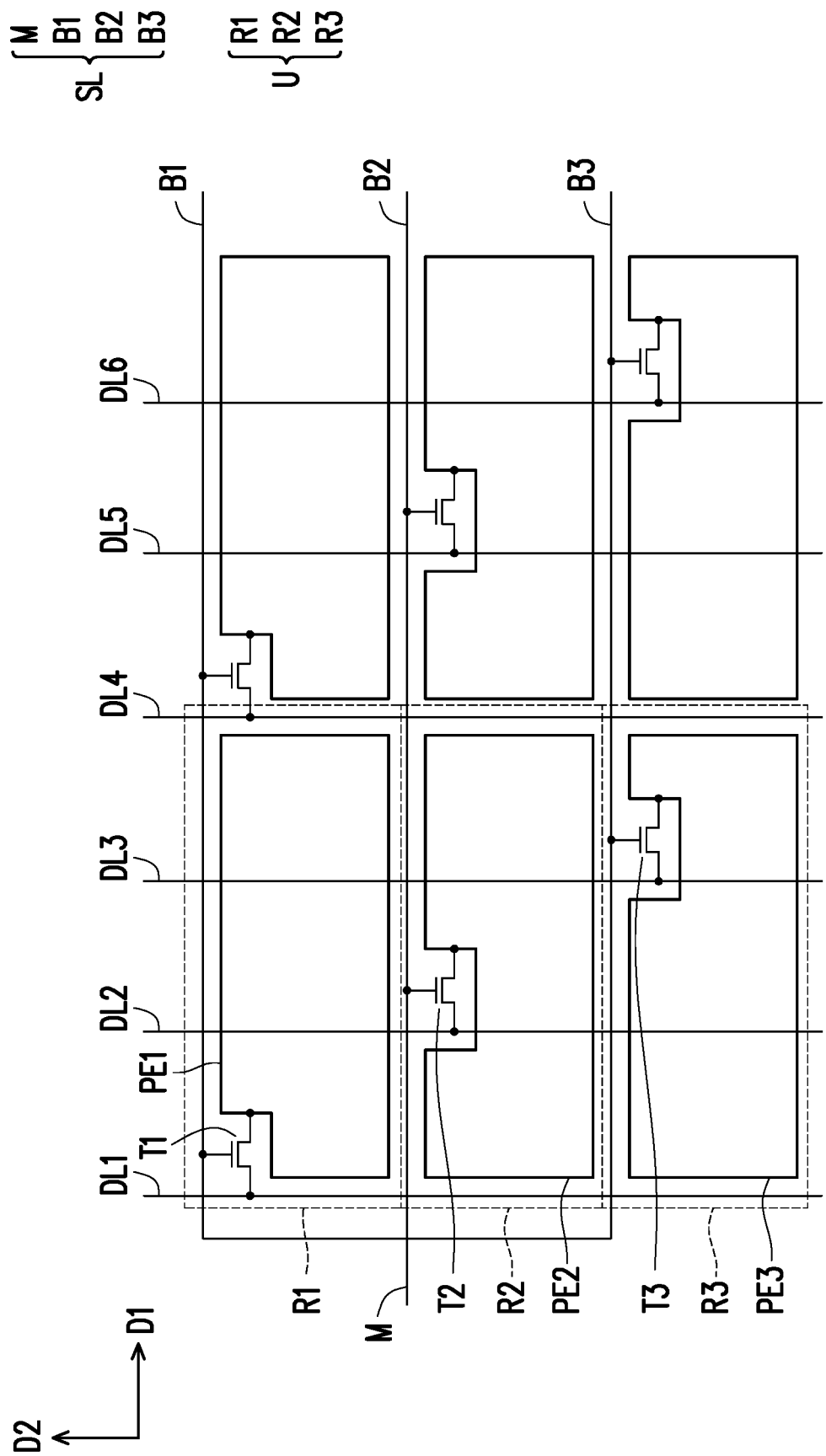
FIG. 2 is a schematic view illustrating a pixel array according to an embodiment of the disclosure.

As provided above, the pixel array PX on the first substrate 10 is shown in FIG. 2 and includes a plurality of pixel unit sets U. In FIG. 2, only two pixel unit sets U are depicted; as a matter of fact, the pixel array is composed of a plurality of repetitively arranged pixel unit sets U. Each of the pixel unit sets U includes a scan line SL, a first data line DL1, a second data line DL2, a first active device T1, a first pixel electrode PE1, a second active device T2, and a second pixel electrode PE2. In an embodiment of the disclosure, the pixel unit set U further includes a third data line DL3, a third active device T3, and a third pixel electrode PE3. Here, each of the pixel unit sets U includes three pixels (including three active devices and three pixel electrodes); however, the number of pixels (active devices and pixel electrodes) in one pixel unit set U is not limited in the disclosure.

Specifically, the substrate 10 (as shown in FIG. 1) has a first pixel region R1 and a second pixel region R2. In the present embodiment, the substrate 10 further includes a third pixel region R3.

The scan line SL includes a main scan line M as well as a first branch scan line B1 and a second branch scan line B2 which are connected to the main scan line M. In the present embodiment, the scan line SL further includes a third branch scan line B3. The first, second, and third branch scan lines B1, B2, and B3 extend along the first direction D1. The first, second, and third branch scan lines B1, B2, and B3 are collectively connected to the main scan line M and are electrically connected to a driving apparatus through the main scan line M. Therefore, a driving signal provided by the driving apparatus is transmitted to first, second, and third branch scan lines B1, B2, and B3 through the main scan line M.

The first data line DL1 and the second data line DL2 extend along a second direction D2. The pixel unit set U provided in the present embodiment further includes a third data line DL3. The first, second, and third data line DL1, DL2, and DL3 extend along the second direction D2. The second direction D2 is different from the first direction D1 and is preferably perpendicular to the first direction D1.

Figure 3:
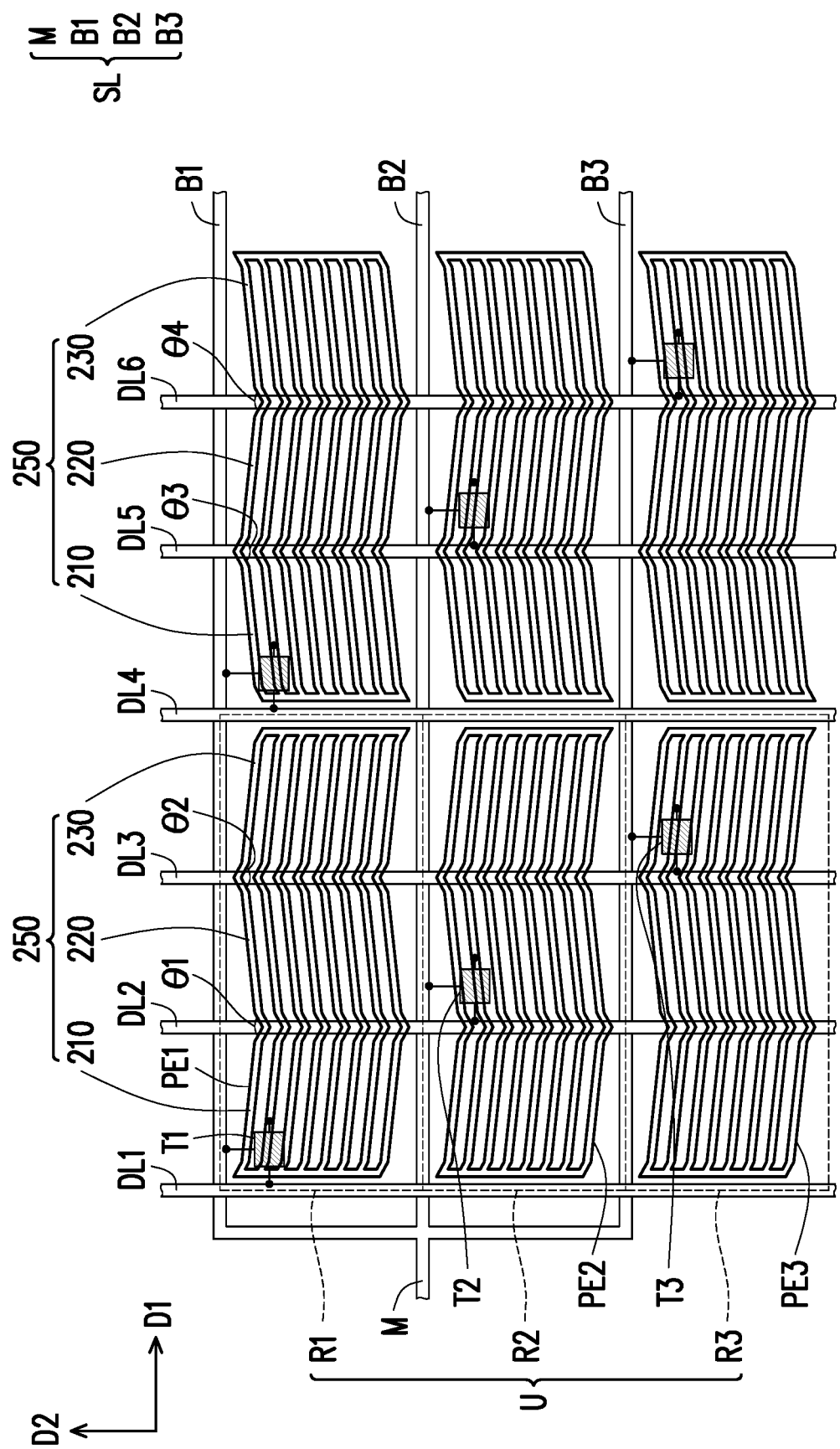
FIG. 3 is a schematic top view illustrating a pixel array according to an embodiment of the disclosure.

The first active device T1 is located in the first pixel region R1 and is electrically connected to the first branch scan line B1 and the first data line DL1. The first pixel electrode PE1 is located in the first pixel region R1 and electrically connected to the first active device T1. The first active device T1 includes a gate, a source, and a drain (not shown). The gate is electrically connected to the first branch scan line B1, the source is electrically connected to the first data line DL1, and the drain is electrically connected to the first pixel electrode PE1. In addition, the first active device T1 may be a top-gate thin film transistor (TFT) or a bottom-gate TFT. The first pixel electrode PE1 may be a block pixel electrode or may have slit patterns, as shown in FIG. 3. In FIG. 3, the first pixel electrode PE1 has a bar-shaped electrode pattern 250 that includes a first bar-shaped electrode 210, a second bar-shaped electrode 220, and a third bar-shaped electrode 230. A first included angle θ1 is made between the first bar-shaped electrode 210 and the second bar-shaped electrode 220, and a second included angle θ2 is made between the second bar-shaped electrode 220 and the third bar-shaped electrode 230. The first included angle θ1 and the second included angle θ2 are both less than 180 degrees and greater than 90 degrees, such as an obtuse angle, and an opening of the first included angle θ1 and an opening of the second included angle θ2 are in opposite directions. A bent portion is formed between the first bar-shaped electrode 210 and the second bar-shaped electrode 220 (with the first included angle θ1), and another bent portion is formed between the second bar-shaped electrode 220 and the third bar-shaped electrode 230 (with the second included angle θ2).

The second active device T2 is located in the second pixel region R2 and is electrically connected to the second branch scan line B2 and the second data line DL2. The second pixel electrode PE2 is located in the second pixel region R2 and electrically connected to the second active device T2. The second active device T2 includes a gate, a source, and a drain (not shown). The gate is electrically connected to the second branch scan line B2, the source is electrically connected to the second data line DL2, and the drain is electrically connected to the second pixel electrode PE2. In addition, the second active device T2 may be a top-gate TFT or a bottom-gate TFT. The second pixel electrode PE2 may be a block pixel electrode or may have slit patterns, as shown in FIG. 3. In FIG. 3, the patterns of the second pixel electrode PE2 are the same as the patterns of the first pixel electrode PE1 and therefore will not be further elaborated hereinafter.

The third active device T3 is located in the third pixel region R3 and is electrically connected to the third branch scan line B3 and the third data line DL3. The third pixel electrode PE3 is located in the third pixel region R3 and electrically connected to the third active device T3. The third active device T3 includes a gate, a source, and a drain (not shown). The gate is electrically connected to the third branch scan line B3, the source is electrically connected to the third data line DL3, and the drain is electrically connected to the third pixel electrode PE3. In addition, the third active device T3 may be a top-gate TFT or a bottom-gate TFT. The third pixel electrode PE3 may be a block pixel electrode or may have slit patterns, as shown in FIG. 3. In FIG. 3, the patterns of the third pixel electrode PE3 are the same as the patterns of the first pixel electrode PE1 and therefore will not be further elaborated hereinafter.

At least one of the first data line DL1 and the second data line DL2 is overlapped with both of the first pixel electrode PE1 and the second pixel electrode PE2. In the present embodiment, at least two of the first data line DL1, the second data line DL2, and the third data line DL3 are overlapped with the first pixel electrode PE1, the second pixel electrode PE2, and the third pixel electrode PE3. Besides, two of the first data line DL1, the second data line DL2, and the third data line DL3 are overlapped with the bent portions of the bar-shaped electrode patterns of the first, second, and third pixel electrodes PE1, PE2, and PE3 (and overlapped with the regions where the first included angle θ1 and the second included angle θ2 are located).

Two first pixel electrodes PE1 of two adjacent pixel unit sets U are taken for example. In one of the pixel unit sets U, if the first included angle θ1 is made between the first bar-shaped electrode 210 and the second bar-shaped electrode 220, and the second included angle θ2 is made between the second bar-shaped electrode 220 and the third bar-shaped electrode 230, in the next pixel unit set along the first direction, a third included angle θ3 is made between the first bar-shaped electrode 210 and the second bar-shaped electrode 220, and a fourth included angle θ4 is made between the second bar-shaped electrode 220 and the third bar-shaped electrode 230. The first included angle θ1 and the second included angle θ2 are each less than 180 degrees and greater than 90 degrees, such as an obtuse angle, and an opening of the first included angle θ1 and an opening of the second included angle θ2 are in opposite directions. The third included angle θ3 and the fourth included angle θ4 are each less than 180 degrees and greater than 90 degrees, such as an obtuse angle, and an opening of the third included angle θ3 and an opening of the fourth included angle θ4 are in opposite directions. It should be mentioned that the display effects are favorable if the bar-shaped electrode patterns of the first, second, and third pixel electrodes PE1, PE2, and PE3 in one of the pixel unit sets U and the next pixel unit set (i.e., in two adjacent pixel unit sets U) are mirror-symmetrical, i.e., if the first included angle θ1 and the third included angle θ3 in the two adjacent pixel unit sets U are in opposite directions, and the second included angle θ2 and the fourth included angle θ4 in the two adjacent pixel unit sets U are in opposite directions; however, the disclosure is not limited thereto. Besides, according to an embodiment of the disclosure, the first, second, third, and fourth included angles θ1, θ2, θ3, and θ4 may be substantially identical, which should however not be construed as a limitation in the disclosure. In other embodiments, the aforesaid four angles may not be completely the same.

Figure 4:
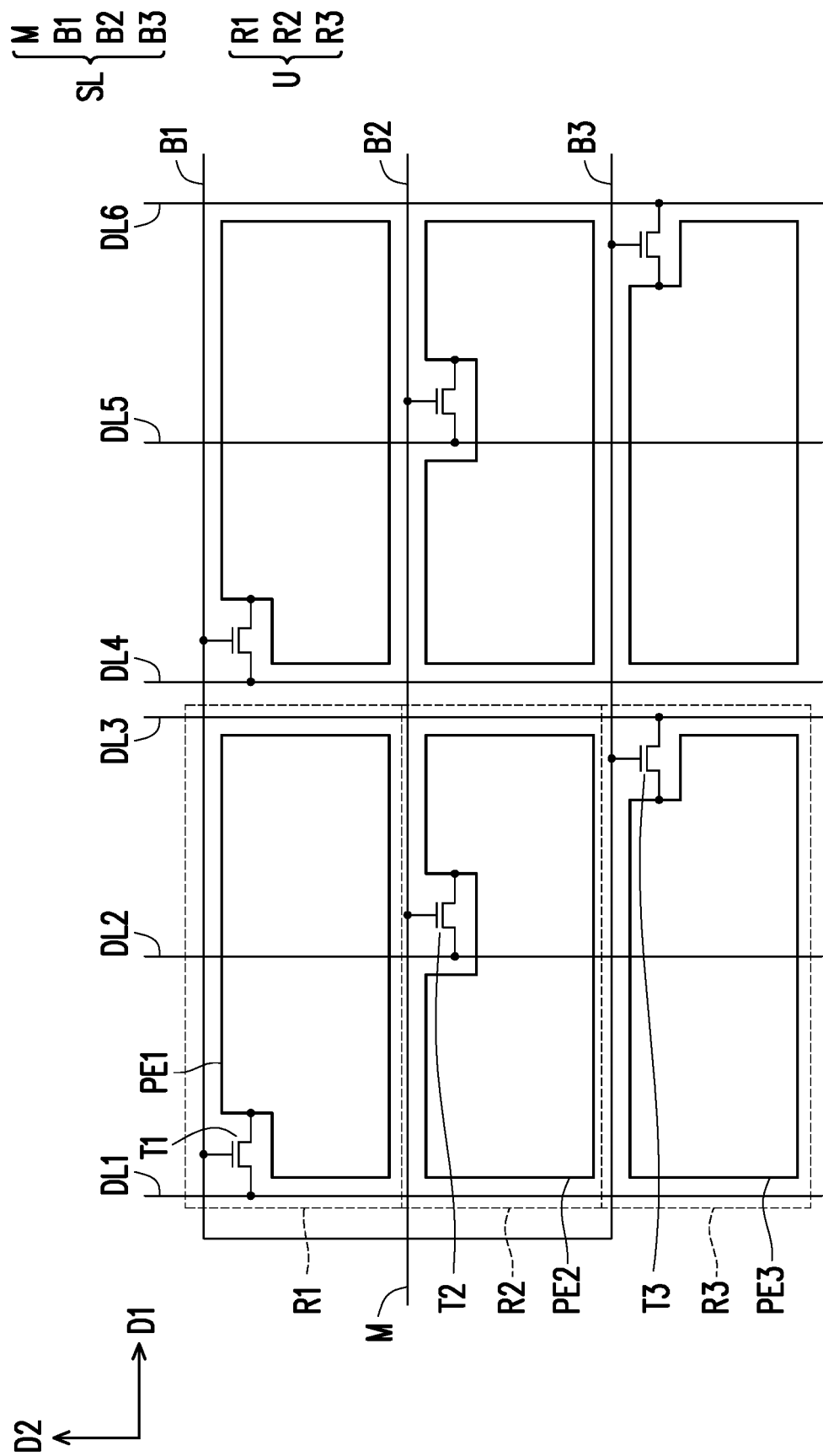
FIG. 4 is a schematic view illustrating a pixel array according to another embodiment of the disclosure.
Figure 5:
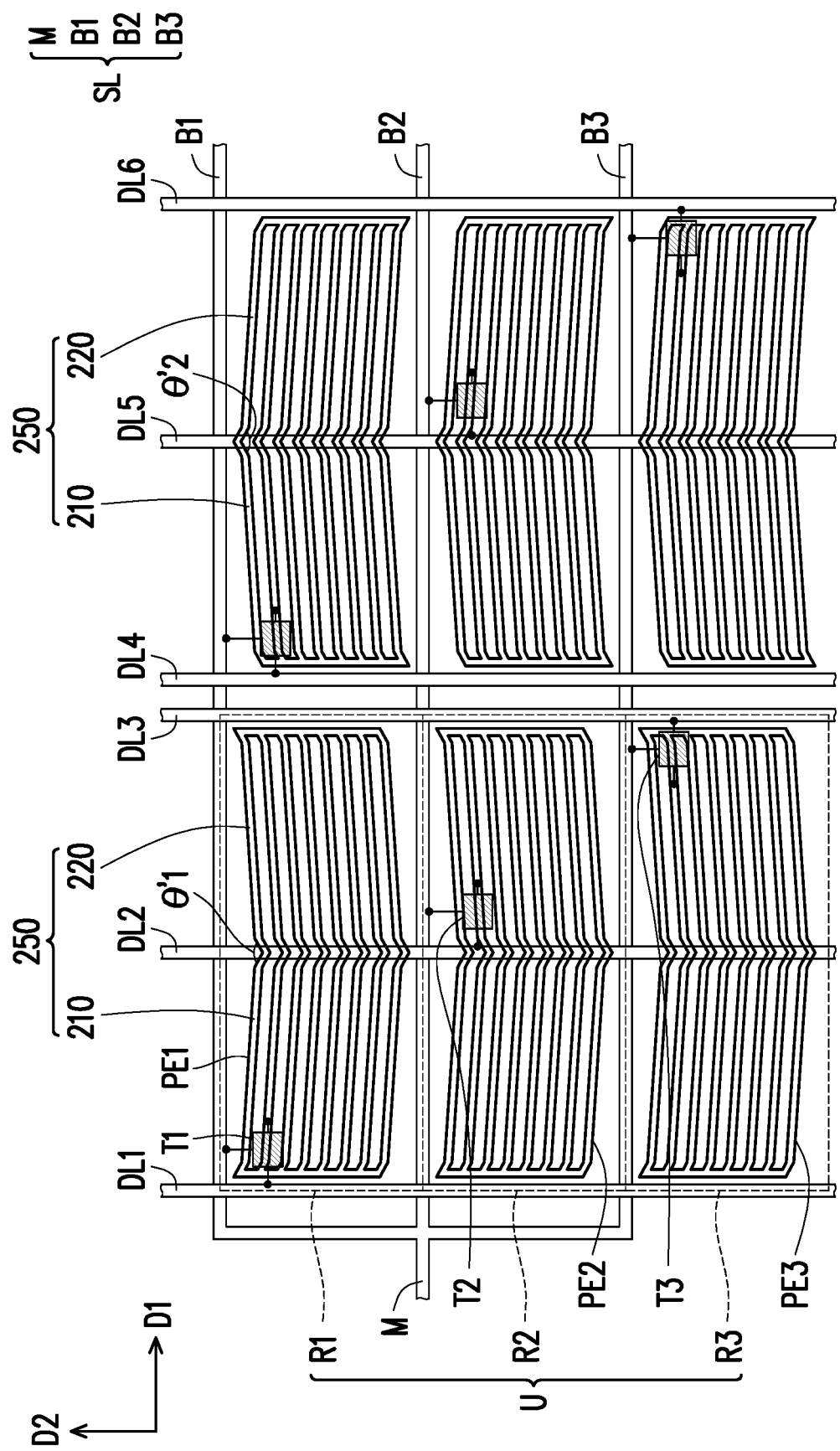
FIG. 5 is a schematic top view illustrating a pixel array according to another embodiment of the disclosure.

FIG. 4 is a schematic view illustrating a pixel array according to another embodiment of the disclosure. FIG. 5 is a schematic top view illustrating a pixel array according to another embodiment of the disclosure. The embodiments depicted in FIG. 4 and FIG. 5 are similar to those depicted in FIG. 2 and FIG. 3; therefore, the same devices in these embodiments are represented by the same reference numbers and will not be further explained. The difference between the embodiments depicted in FIG. 4 and FIG. 5 and the embodiments depicted in FIG. 2 and FIG. 3 lies in that the first data line DL1 and the third data line DL3 are not overlapped with the first pixel electrode PE1, the second pixel electrode PE2, and the third pixel electrode PE3, and the second data line DL2 is overlapped with the first pixel electrode PE1, the second pixel electrode PE2, and the third pixel electrode PE3. Namely, the first data line DL1 and the third data line DL3 are arranged on two sides of the first pixel electrode PE1, the second pixel electrode PE2, and the third pixel electrode PE3, and the second data line DL2 passes through the first pixel electrode PE1, the second pixel electrode PE2, and the third pixel electrode PE3.

In the embodiment shown in FIG. 5, the first pixel electrode PE1 has a bar-shaped electrode pattern 250, and the bar-shaped electrode pattern 250 includes a first bar-shaped electrode 210 and a second bar-shaped electrode 220. A first included angle θ'1 is made between the first bar-shaped electrode 210 and the second bar-shaped electrode 220. The first included angle θ'1 between the first bar-shaped electrode 210 and the second bar-shaped electrode 220 constitutes the bent portion. One of the first data line DL1, the second data line DL2, and the third data line DL3 is overlapped with the bent portion (where the first included angle θ'1 is located). Here, the bar-shaped electrode patterns of the first, second, and third pixel electrodes PE1, PE2, and PE3 in one of the pixel unit sets U and the next pixel unit set (i.e., the two adjacent pixel unit sets U adjacent along the first direction) have the same pattern design. Specifically, in the next pixel unit set, a second included angle θ'2 is made between the first bar-shaped electrode 210 and the second bar-shaped electrode 220 of the bar-shaped electrode pattern. If the first included angle θ'1 and the second included angle θ'2 are each less than 180 degrees and greater than 90 degrees, such as an obtuse angle, and an opening of the first included angle θ'1 and an opening of the second included angle θ'2 are in opposite directions, the display effects are favorable, which should however not be construed as limitations in the disclosure. Besides, according to an embodiment of the disclosure, the first and second included angles θ'1 and θ'2 may be substantially identical, which should however not be construed as a limitation in the disclosure. In other embodiments, the aforesaid two angles may not be completely the same.

In the display panel provided herein, a specifically designed structure is arranged between the aforesaid structure of the pixel array and the light shielding pattern layer, such that the issue of unfavorable display quality caused by misalignment can be prevented in the event that the display panel serves as a curved display panel. The detailed descriptions are given as follows.

Figure 6:
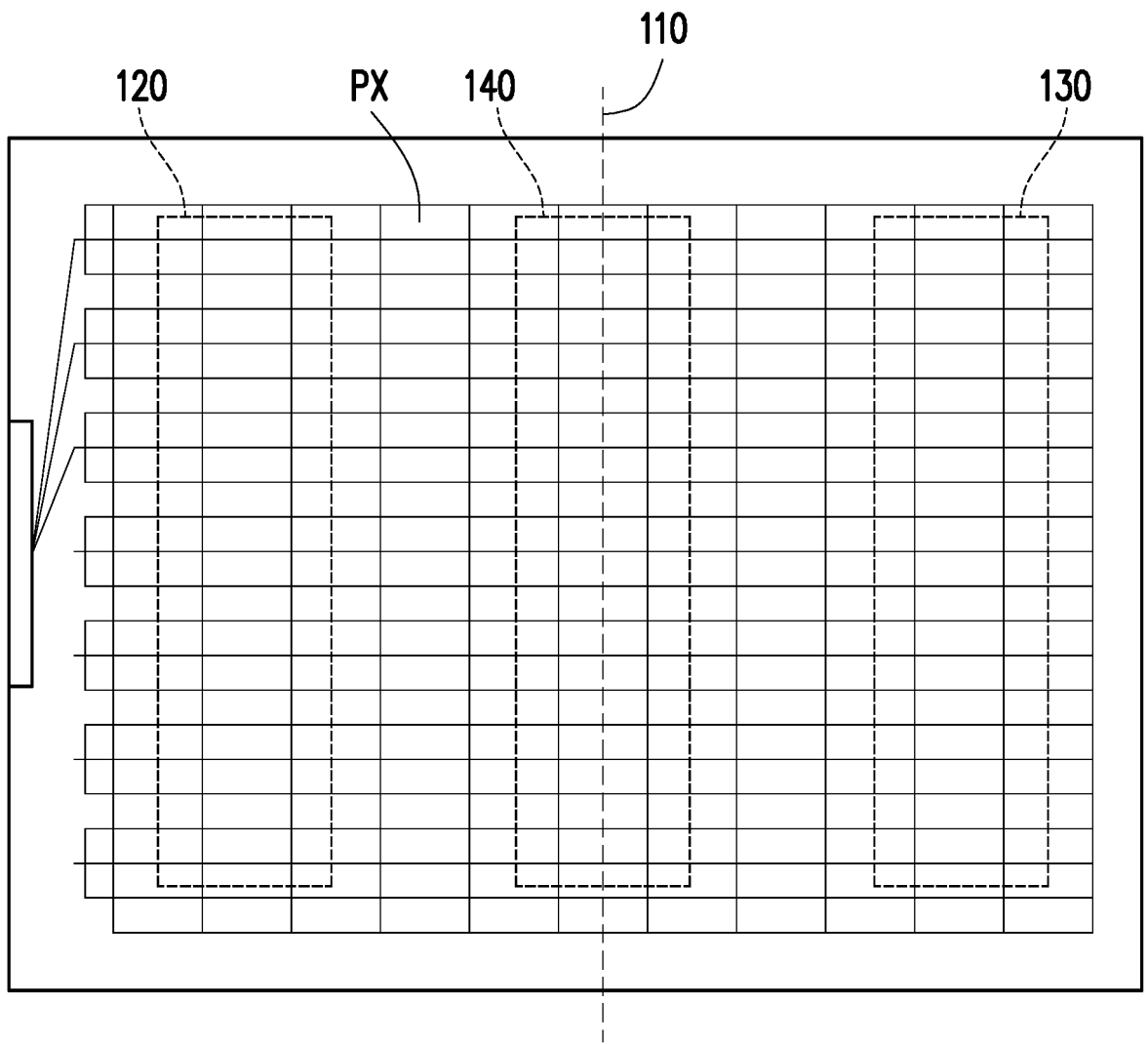
FIG. 6 is a schematic view illustrating a display panel according to an embodiment of the disclosure.
Figure 7:
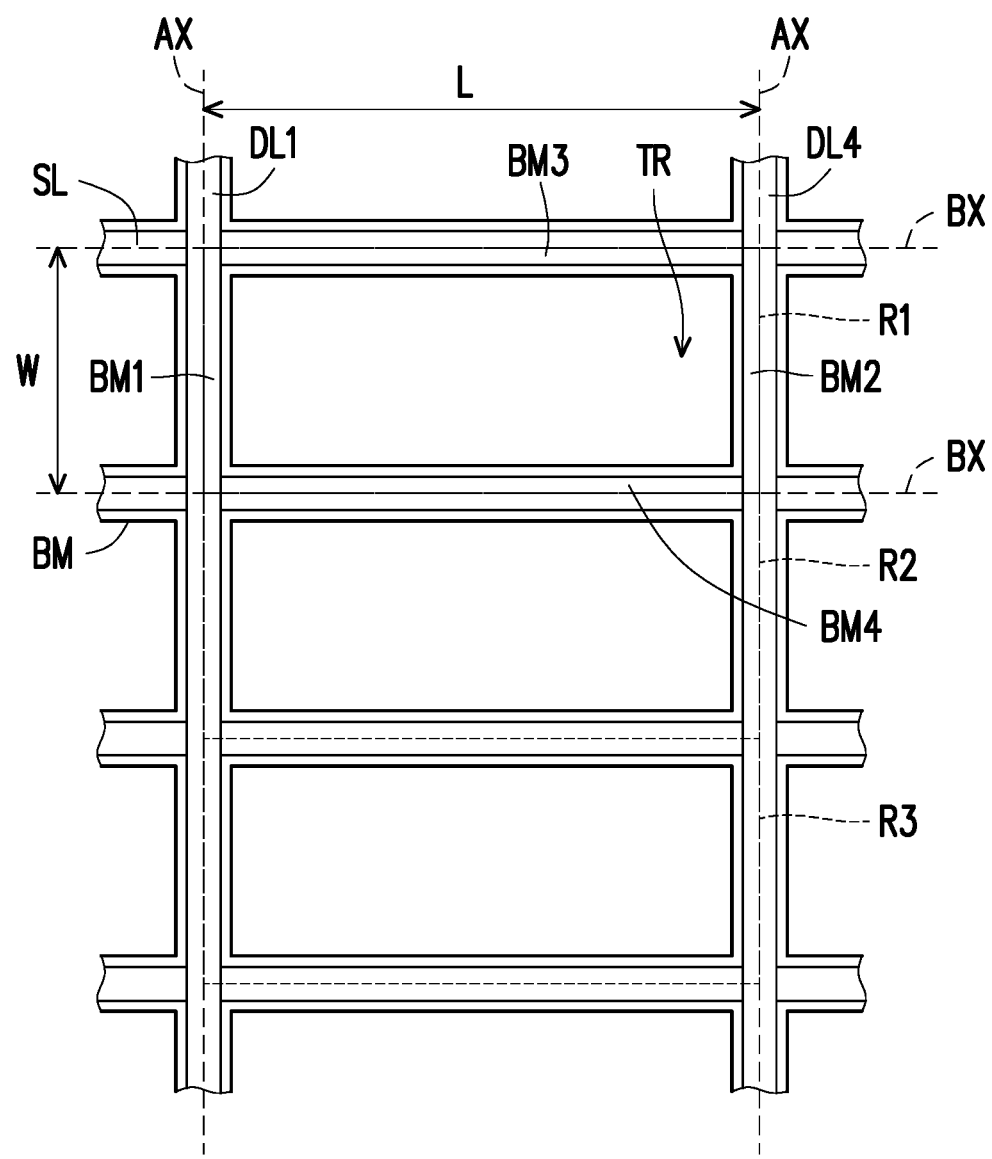
FIG. 7 is a schematic view illustrating a light shielding pattern layer according to an embodiment of the disclosure.

FIG. 6 is a schematic view illustrating a display panel according to an embodiment of the disclosure. FIG. 7 is a schematic view illustrating a light shielding pattern layer according to an embodiment of the disclosure. With reference to FIG. 6, the display panel has a central axis 110, a central region 140 corresponding to the central axis 110, a first region 120, and a second region 130, and the first and second regions 120 and 130 are located at two sides of the central region 140. In FIG. 6, the first and second regions 120 and 130 are depicted, whereas the number of regions at two sides of the central region 140 is not limited to two in the disclosure. As a matter of fact, the number of regions at two side of the central region 140 may be four, six, eight, or more according to the dimensions of the panel, the degree to which the panel is bent, the process parameters, and so on.

In the display panel shown in FIG. 6, the pixel array PX may be the pixel array shown in the embodiment of FIG. 2 and FIG. 3 or the pixel array shown in the embodiment of FIG. 4 and FIG. 5. For example, the light shielding pattern layer corresponding to the pixel array PX of FIG. 2 and FIG. 3 is as shown in FIG. 7. In FIG. 7, the first, second, and third pixel regions R1, R2, and R3 are arranged corresponding to the light shielding pattern layer BM, and the arrangement of devices in the first, second, and third pixel regions R1, R2, and R3 is the same as the arrangement in the pixel unit sets U depicted in FIG. 3. Note that the extension direction D2 of the central axis 110 of the display panel is parallel to the extension direction of the data lines (e.g., the first data line DL1) shown in FIG. 3 and is perpendicular to the extension direction D1 of the scan line SL shown in FIG. 3.

Each of the first pixel region R1, the second pixel region R2, and the third pixel region R3 has a long side L and a short side W, the long side L is parallel to the first direction D1, and the short side W is parallel to the second direction D2. That is, the long sides L of the first, second, and third pixel regions R1, R2, and R3 are perpendicular to the extension direction of the central axis 110 of the display panel. The light shielding pattern layer BM defines a plurality of light transmissive regions TR, and each of the light transmissive regions TR corresponds to the first pixel region R1, the second pixel region R2, and the third pixel region R3. The light shielding pattern layer BM around the light transmissive regions TR corresponds to the scan line SL and the data lines DL1, DL2, and DL3, and the shielding pattern layer BM distributed in each of the pixel regions (i.e., the first, second, or third pixel region R1, R2, or R3) is divided into a first light shielding portion BM1, a second light shielding portion BM2, a third light shielding portion BM3, and a fourth light shielding portion BM4. The first light shielding portion BM1 and the second light shielding portion BM2 both extend along the second direction D2. The third light shielding portion BM3 and the fourth light shielding portion BM4 both extend along the first direction D1. Here, the first and second light shielding portions BM1 and BM2 are arranged according to the location of the central axis of the data lines DL1 and DL4; and the third and fourth light shielding portions BM3 and BM4 are arranged according to the location of the central axis of the scan line SL. In another embodiment (not shown), the light shielding pattern layer BM shown in FIG. 7 may correspond to the pixel array PX of FIG. 4 and FIG. 5, in which the first and second light shielding portions BM1 and BM2 are arranged according to the location of the central axis of the data lines DL1 and DL3; and the third and fourth light shielding portions BM3 and BM4 are arranged according to the location of the central axis of the scan line SL.

Figure 8:
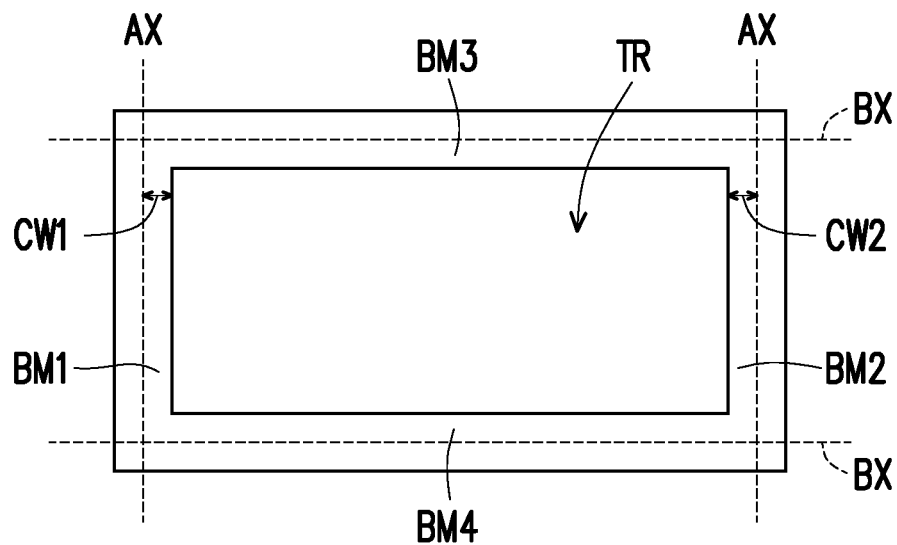
FIG. 8, FIG. 9, and FIG. 10 are schematic views illustrating a light shielding pattern layer located in a central region, a first region, and a second region of a display panel according to an embodiment of the disclosure.

As depicted in FIG. 8, in the central region 140 of the display panel shown in FIG. 6, a width of the first light shielding portion BM1 of the light shielding pattern layer BM is CW1, and the width CM1 stands for the distance from the edge of the light transmissive regions TR to the corresponding central axis AX of the data lines. A width of the second light shielding portion BM2 is CW2, and the width CM2 stands for the distance from the edge of the light transmissive regions TR to the corresponding central axis AX of the data line. CW1=CW2.

Figure 9:
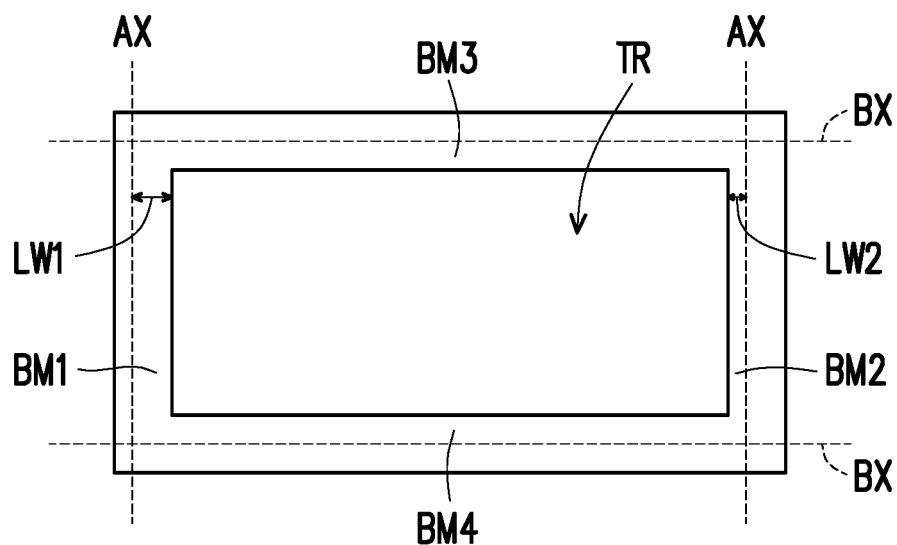

As depicted in FIG. 9, in the first region 120 of the display panel shown in FIG. 6, a width of the first light shielding portion BM1 of the light shielding pattern layer BM is LW1, which is apart from the central axis 110, and the width LW1 stands for the distance from the edge of the light transmissive regions TR to the corresponding central axis AX of the data lines. A width of the second light shielding portion BM2 is LW2, which is closer to the central axis 110, and the width LW2 stands for the distance from the edge of the light transmissive regions TR to the corresponding central axis AX of the data line. LW1≠LW2. Here, LW1>LW2, and (LW1+LW2)/2=CW1=CW2.

Figure 10:
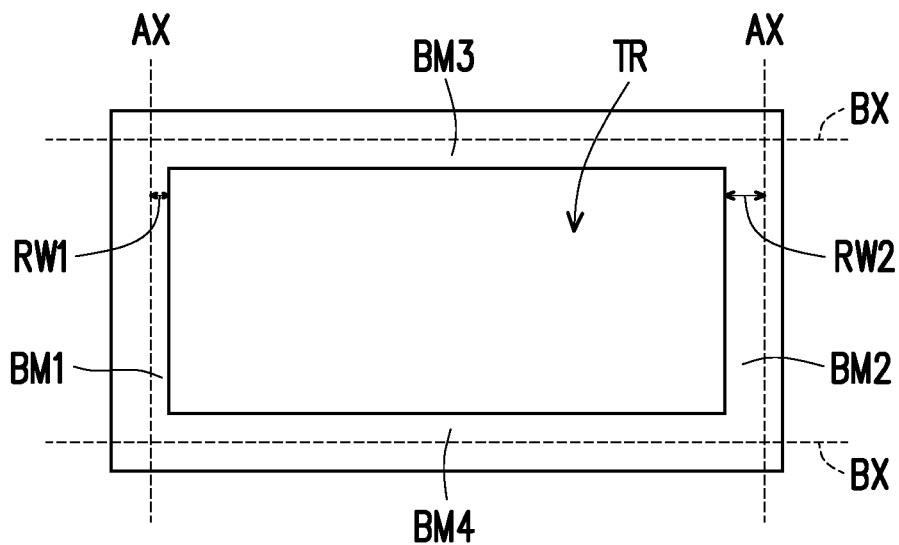

As depicted in FIG. 10, in the second region 130 of the display panel shown in FIG. 6, a width of the first light shielding portion BM1 of the light shielding pattern layer BM is RW1, which is closer to the central axis 110, and the width RW1 stands for the distance from the edge of the light transmissive regions TR to the corresponding central axis AX of the data lines. A width of the second light shielding portion BM2 is RW2, which is apart from the central axis 110, and the width RW2 stands for the distance from the edge of the light transmissive regions TR to the corresponding central axis AX of the data line. RW1≠RW2. Here, RW1<RW2, and (RW1+RW2)/2=CW1=CW2.

Figure 11:
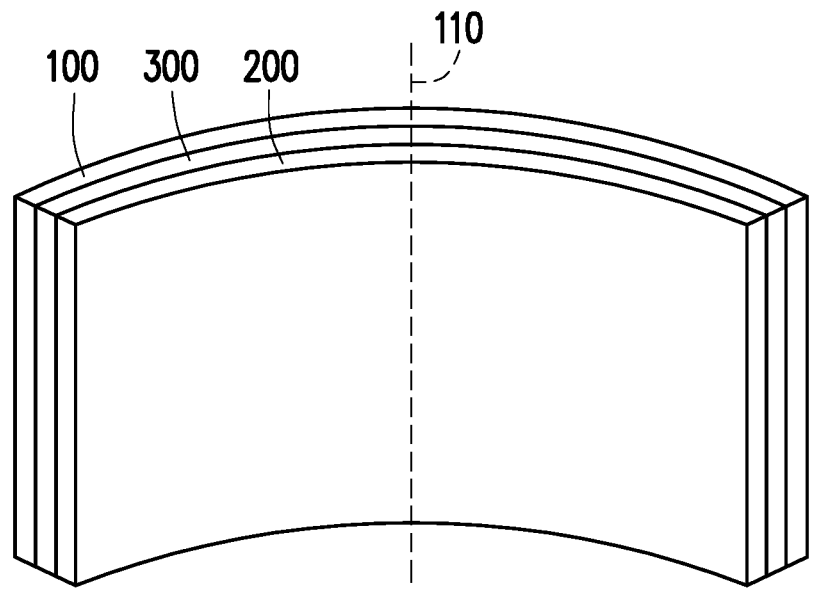
FIG. 11 is a schematic view illustrating a curved display panel according to an embodiment of the disclosure.

In the light shielding pattern layer BM shown in FIG. 8, FIG. 9, and FIG. 10, the correlation between the width of the first light shielding portion BM1 of the light shielding pattern layer BM and the width of the second light shielding portion BM2 of the light shielding pattern layer BM results from bending the display panel shown in FIG. 6 inwards along the central axis 110, that is, the color filter substrate 200 is located inside of the curved display panel, so as to form the curved display panel shown in FIG. 11. On the contrary, if the display panel shown in FIG. 6 is bent outwards along the central axis 110, that is, the pixel array substrate 100 is located inside of the curved display panel, the correlation between the width of the first light shielding portion BM1 of the light shielding pattern layer BM and the width of the second light shielding portion BM2 of the light shielding pattern layer BM is expressed below: LW1<LW2, CW1=CW2, and RW1>RW2.

In the previous embodiment, the curved display panel shown in FIG. 11 serves as an example to elaborate the widths of the light shielding layer in different regions; as a matter of fact, the correlation between the widths of the light shielding layer in different regions may vary according to the direction in which the curved display panel is bent and the location where the pixel array/the light shielding layer is arranged, as shown in Table 1.

TABLE 1

| | | |
|---|---|---|
| The curved display panel is bent inwards (as shown in FIG. 11) | The pixel array is located on the first substrate; the light shielding layer is located on the second substrate | LW1 > LW2<br>CW1 = CW2<br>RW1 < RW2 |
| The curved display panel is bent outwards | The pixel array is located on the first substrate; the light shielding layer is located on the second substrate | LW1 < LW2<br>CW1 = CW2<br>RW1 > RW2 |
| The curved display panel is bent inwards | The pixel array is located on the second substrate; the light shielding layer is located on the first substrate | LW1 < LW2<br>CW1 = CW2<br>RW1 > RW2 |
| The curved display panel is bent outwards | The pixel array is located on the second substrate; the light shielding layer is located on the first substrate | LW1 > LW2<br>CW1 = CW2<br>RW1 < RW2 |

Additionally, given that the number of regions on the left side of the central region 140 is one or more, and so is the number of the regions on the right side of the central region 140, the widths of the light shielding portions in each region on the left side of the central region 140 may be different, and the widths of the light shielding portions in each region on the right side of the central region 140 may be different as well. Namely, the width of the light shielding portion in each region may be designed according to the misalignment between the pixel array and the light shielding pattern layer in different regions of the curved display panel.

To sum up, in each of the pixel unit sets of the pixel array provided herein, the scan line includes the main scan line, the first branch scan line, and the second branch scan line, and the first branch scan line and the second branch scan line are connected to the main scan line. At least one of the first data line and the second data line is overlapped with both of the first pixel electrode and the second pixel electrode. Thereby, the selection of gate driving chips can be more diverse. In addition, owing to the arrangement of the pixel array in the curved display panel, the issue of unfavorable display quality resulting from the misalignment of the pixel unit sets on the pixel array and the devices on the other substrate can be resolved to a great extent. Moreover, the specifically designed width of the light shielding pattern layer allows the signal lines (such as data lines) of the pixel array and the light shielding pattern layer to be correspondingly overlapped in case of the misalignment of the pixel array and the light shielding pattern layer in the curved display panel, so as to prevent the display quality from being deteriorated.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A pixel array comprising a plurality of pixel unit sets, each of the pixel unit sets comprising:
    a substrate having a first pixel region, a second pixel region, and a third pixel region;
    a scan line comprising a main scan line, a first branch scan line, a second branch scan line, and a third branch scan line, wherein the first branch scan line, the second branch scan line, and the third branch scan line are connected to the main scan line and extended along a first direction;
    a first data line, a second data line, and a third data line extending along a second direction;
    a first active device located in the first pixel region and electrically connected to the first branch scan line and the first data line;
    a first pixel electrode located in the first pixel region and electrically connected to the first active device;
    a second active device located in the second pixel region and electrically connected to the second branch scan line and the second data line;
    a second pixel electrode located in the second pixel region and electrically connected to the second active device;
    a third active device located in the third pixel region and electrically connected to the third branch scan line and the third data line; and
    a third pixel electrode located in the third pixel region and electrically connected to the third active device,
    wherein each of the first pixel electrode, the second pixel electrode, and the third pixel electrode has a bar-shaped electrode pattern, the bar-shaped electrode pattern has at least one bent portion, and the second data line and the third data line are overlapped with the bent portions of the bar-shaped electrode patterns of the first pixel electrode, the second pixel electrode, and the third pixel electrode, and
    wherein the second data line is disposed between the first data line and the third data line.

2. The pixel array of claim 1, wherein the second data line and the third data line are overlapped with the first pixel electrode, the second pixel electrode, and the third pixel electrode.

3. The pixel array of claim 2, wherein the bar-shaped electrode pattern has at least two bent portions, and the second data line and the third data line are respectively overlapped with the at least two bent portions of the bar-shaped electrode patterns of the first pixel electrode, the second pixel electrode, the third pixel electrode.

4. The pixel array of claim 3, wherein
    in each of the pixel unit sets, the bar-shaped electrode pattern comprises a first bar-shaped electrode, a second bar-shaped electrode, and a third bar-shaped electrode, a first included angle is included between the first bar-shaped electrode and the second bar-shaped electrode, a third included angle is included between the second bar-shaped electrode and the third bar-shaped electrode, wherein each of the first included angle and the third included angle is an obtuse angle, and an opening of the first included angle and an opening of the third included angle are in opposite directions.

5. The pixel array of claim 4, wherein
    a second included angle is included between the first bar-shaped electrode and the second bar-shaped electrode of the bar-shaped electrode pattern in a next pixel unit set along the first direction, a fourth included angle is included between the second bar-shaped electrode and the third bar-shaped electrode of the bar-shaped electrode pattern in the next pixel unit set, each of the second included angle and the fourth included angle is an obtuse angle, an opening of the second included angle and an opening of the fourth included angle are in opposite directions, and the opening of the third included angle and the opening of the second included angle are in the same direction.

6. The pixel array of claim 1, wherein
in each of the pixel unit sets, the bar-shaped electrode pattern comprises a first bar-shaped electrode and a second bar-shaped electrode, and a first included angle is included between the first bar-shaped electrode and the second bar-shaped electrode, a second included angle is included between the first bar-shaped electrode and the second bar-shaped electrode of the bar-shaped electrode pattern in a next pixel unit set along the first direction, each of the first included angle and the second included angle is an obtuse angle, and an opening of the first included angle and an opening of the second included angle are in opposite directions.

7. The pixel array of claim 1, wherein each of the first pixel region, the second pixel region, and the third pixel region has a long side and a short side, the long side is parallel to the first direction, and the short side is parallel to the second direction.

8. A display panel having a central region, a first region, and a second region, the first region and the second region being located at two sides of the central region, the display panel comprising:
a first substrate;
a pixel array located on the first substrate, the pixel array comprising a plurality of pixel unit sets, wherein each of the pixel unit sets is as recited in claim 1,
a second substrate located opposite to the first substrate;
a color filter layer located on the first substrate or the second substrate, the color filter layer being arranged corresponding to the pixel array; and
a light shielding pattern layer located on the second substrate, the light shielding pattern layer being arranged corresponding to the color filter layer.

9. The display panel of claim 8, wherein each of the first pixel region, the second pixel region, and the third pixel region has a long side and a short side, the long side is parallel to the first direction, and the short side is parallel to the second direction.

10. The display panel of claim 9, wherein the light shielding pattern layer defines a plurality of light transmissive regions, each of the light transmissive regions corresponds to the first pixel region, the second pixel region, or the third pixel region in one of the pixel unit sets, and the light shielding pattern layer around each of the light transmissive regions is divided into:
a first light shielding portion and a second light shielding portion both extending along the second direction; and
a third light shielding portion and a fourth light shielding portion both extending along the first direction.

11. The display panel of claim 10,
in the first region of the display panel, a width of the first light shielding portion of the light shielding pattern layer being LW1, a width of the second light shielding portion of the light shielding pattern layer being LW2, $LW1 \neq W2$;
in the central region of the display panel, a width of the first light shielding portion of the light shielding pattern layer being CW1, a width of the second light shielding portion of the light shielding pattern layer being CW2, CW1=CW2; and
in the second region of the display panel, a width of the first light shielding portion of the light shielding pattern layer being RW1, a width of the second light shielding portion of the light shielding pattern layer being RW2, $RW1 \neq RW2$.

12. The display panel of claim 11, wherein $LW1>LW2, CW1=CW2$, and $RW1<RW2$; or $LW1<LW2, CW1=CW2$, and $RW1>RW2$.

13. The display panel of claim 12, wherein $(LW1+LW2)/2=(RW1+RW2)/2=CW1=CW2$.

* * * * *